United States Patent
Poteet et al.

(10) Patent No.: US 11,402,245 B2
(45) Date of Patent: Aug. 2, 2022

(54) AIR DATA PROBE CORROSION PROTECTION

(71) Applicant: Rosemount Aerospace Inc., Burnsville, MN (US)

(72) Inventors: Steven Poteet, Hamden, CT (US); Blair A Smith, South Windsor, CT (US)

(73) Assignee: Rosemount Aerospace Inc., Burnsville, MN (US)

( * ) Notice: Subject to any disclaimer, the term of this patent is extended or adjusted under 35 U.S.C. 154(b) by 223 days.

(21) Appl. No.: 16/539,561

(22) Filed: Aug. 13, 2019

(65) Prior Publication Data
US 2021/0048322 A1 Feb. 18, 2021

(51) Int. Cl.
*G01F 1/05* (2006.01)
*C23C 16/455* (2006.01)
*G01P 5/165* (2006.01)

(52) U.S. Cl.
CPC .......... *G01F 1/05* (2013.01); *C23C 16/45525* (2013.01); *G01P 5/165* (2013.01)

(58) Field of Classification Search
None
See application file for complete search history.

(56) References Cited

U.S. PATENT DOCUMENTS

| | | | |
|---|---|---|---|
| 2,399,370 A | 4/1946 | McOrlly | |
| 5,543,183 A * | 8/1996 | Streckert | G01P 5/165 427/295 |
| 6,134,972 A | 10/2000 | Streckert et al. | |
| 9,772,345 B2 * | 9/2017 | Golly | G01P 13/025 |
| 9,834,849 B2 | 12/2017 | Sammelselg et al. | |
| 2017/0159178 A1 * | 6/2017 | Baker | C23C 28/42 |
| 2018/0016678 A1 | 1/2018 | Fenwick et al. | |
| 2019/0078209 A1 | 3/2019 | Boccard et al. | |

FOREIGN PATENT DOCUMENTS

| | | |
|---|---|---|
| CN | 105154879 A | 12/2015 |
| CN | 107556827 A | 1/2018 |
| EP | 0932831 A1 | 8/1999 |
| GB | 2455993 A | 7/2009 |

OTHER PUBLICATIONS

Extended European Search Report for EP Application No. 19215820.2, dated Jul. 3, 2020, pp. 10.

* cited by examiner

*Primary Examiner* — Lisa M Caputo
*Assistant Examiner* — Nigel H Plumb
(74) *Attorney, Agent, or Firm* — Kinney & Lange, P. A.

(57) ABSTRACT

An air data probe with a corrosion protection coating system includes a body with an external and an internal surface and a uniform, pinhole-free first protection layer applied by atomic layer deposition (ALD) to reduce corrosion of the body, including corrosion initiated by sulfur and nitrogen compounds. The air data probe further includes a second protection layer, covering the first protection layer over the external surfaces of the body to protect the air data probe from foreign object impact damage.

20 Claims, 4 Drawing Sheets

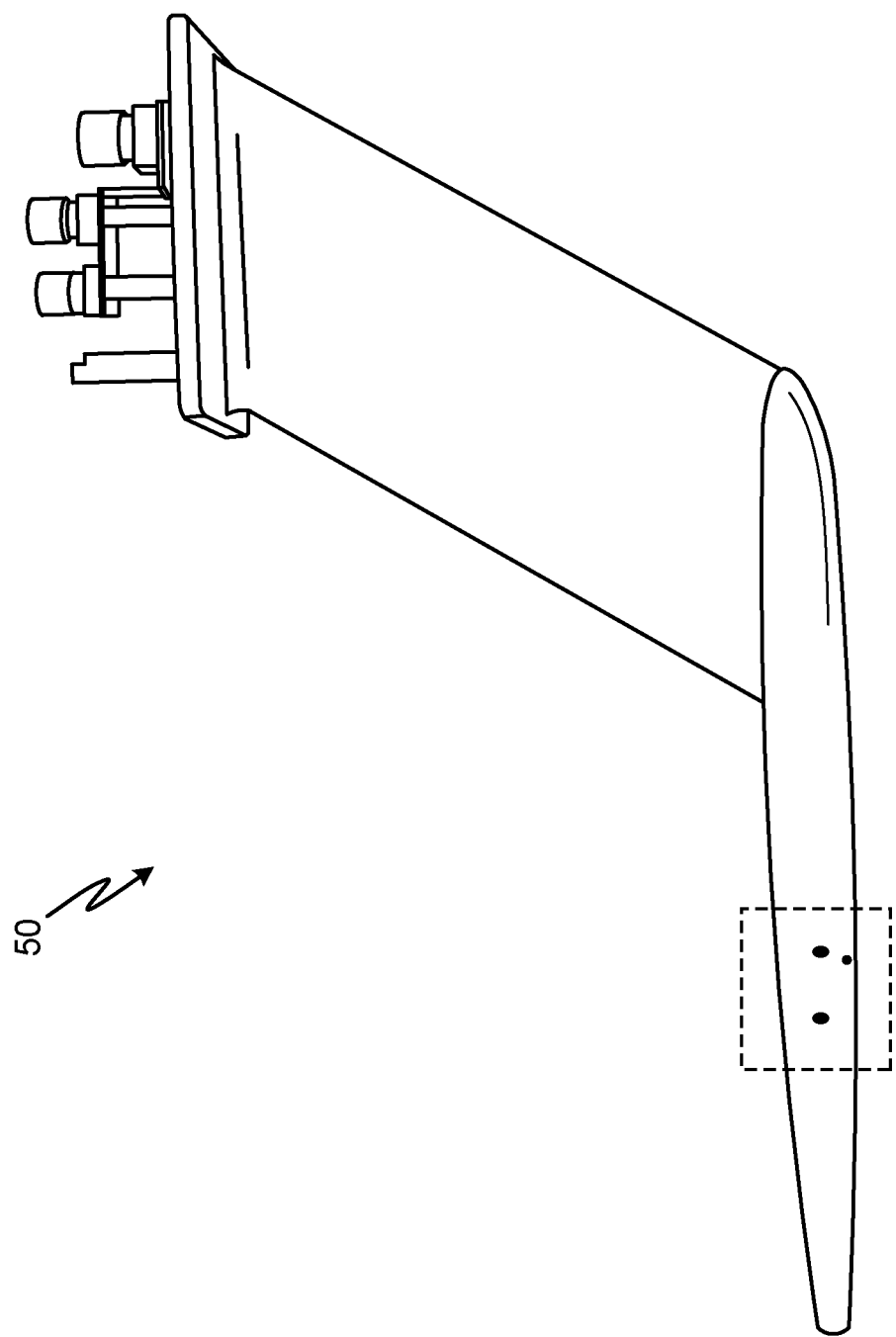

AIR DATA PROBE CORROSION PROTECTION

BACKGROUND

The present disclosure relates generally to air data probes. More specifically, this disclosure relates to corrosion barrier coatings of air data probes.

Many components of an aircraft are coated with corrosion barriers to increase the useful life of the components by increasing the corrosion resistance of the components. There are various environmental insults that may be present in, for example, a gas turbine engine under load such as cyclic high temperatures. Some conventional corrosion barriers are able to partially mitigate the impact of corrosive environments within the aircraft.

For example, an air data probe for an aircraft formed of nickel or a nickel alloy may experience sporadic temperature fluctuations greater than 1000° F. (538° C.). In the presence of sulfur, the air data probe corrodes at an accelerated rate compared to nickel and nickel alloys in absence of sulfur. A corrosion barrier system which mitigates corrosion, even if initiated by sulfur or nitrogen compounds, such as $SO_x$ or $NO_x$, of an air data probe formed of nickel or a nickel alloy is desirable.

SUMMARY

An air data probe with a corrosion protection coating system includes a body with an external and an internal surface and a uniform, pinhole-free first protection layer applied by atomic layer deposition (ALD) to reduce corrosion of the body, including corrosion initiated by sulfur or nitrogen compounds. The air data probe further includes a second protection layer, covering the first protection layer over the external surfaces of the body to protect the air data probe from foreign object impact damage.

A method of applying a corrosion protection coating system on an air data probe includes applying a uniform, pinhole-free first protection layer to external and internal surfaces of a body by ALD to reduce corrosion of the body, including corrosion initiated by sulfur or nitrogen compounds and applying a second protection layer over the first protection layer on the external surfaces of the substrate to protect the air data probe from foreign object impact damage.

BRIEF DESCRIPTION OF THE DRAWINGS

FIG. 1A is a drawing of a pitot probe.

DETAILED DESCRIPTION

It has been discovered that air data probes are currently experiencing external and internal corrosion on aircraft that operate in coastal routes, especially in regions with elevated sulfurous gas levels in the atmosphere such as southeast Asia. Sulfurous gases can arise from sources such as the burning or combustion of jet fuel containing sulfur compounds, coal gasification, petrochemical processing, volcanic eruption which can include $SO_2$, $H_2S$, sulfur hexafluoride, and carbonyl sulfides.

For example, an air contaminant such as $SO_2$ accelerates the corrosion of nickel by sulfidation, which can penetrate the nickel sheath and cause failure of the air data probe. Errors in air data probe readings can be extremely dangerous as the information obtained from the air data probe, such as altitude, air speed, and attitude are potentially safety-critical. Several commercial airline disasters have been traced to a failure of a pitot-static system.

Additionally, the external surfaces of the air data probes are susceptible to foreign object damage (FOD). Dust or other particulates found in the atmosphere can erode exposed surfaces of components or coatings designed for corrosion protection. Although dust and particulates have relatively low mass, when an aircraft accelerates up to speeds traveling several hundred miles per hour, the dust and particulates have enough energy to cause significant erosion of external component surfaces over time and any coatings formed over the external component surfaces. For example, a Ni surface, which has started to corrode forming a Ni-sulfide compound, is brittle and readily removed by FOD. Also, a thin ALD coating is more susceptible to FOD compared to a thicker coating layer applied by chemical vapor deposition (CVD), physical vapor deposition (PVD), or electroplating techniques over the ALD layer.

An air data probe with a corrosion barrier system, which protects the nickel substrate from corrosion, including sulfidation, and protects the exposed surfaces from FOD, is disclosed herein. The disclosed corrosion barrier system extends the usable life of the air data probe.

Figure 1B:
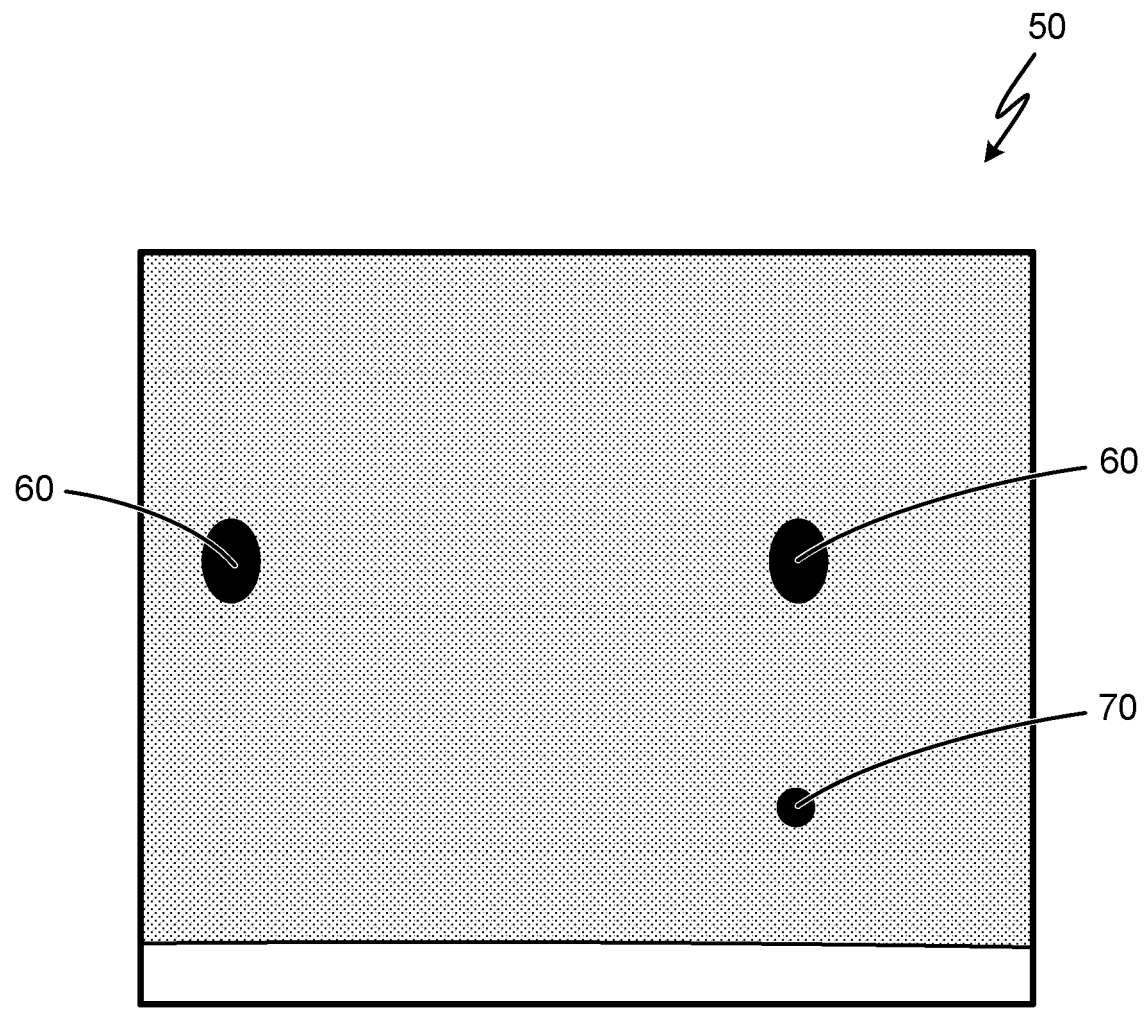
FIG. 1B is an enlarged sectional drawing of the pitot tube shown in FIG. 1A.

FIGS. 1A and 1B will be discussed together. FIG. 1A is a drawing of a pitot tube. FIG. 1A shows pitot tube 50 with pressure ports. FIG. 1B is an enlarged sectional drawing of pitot tube 50 shown in FIG. 1A. FIG. 1B shows pitot tube 50 with pressure ports 60 and drain port 70.

The darkened region of pitot tube 50 (shown in FIG. 1A) illustrates that external corrosion occurs to a greater extent near the tip of pitot tube 50, which experiences the highest temperatures, air speed, and blunt force FOD impact (90°). However, some air data probes show maximum roughness further back from the tip, indicating more corrosive activity in those areas. For example, FIG. 1B shows a roughened external surface of pitot tube 50 surrounding pressure ports 60.

Figure 2:
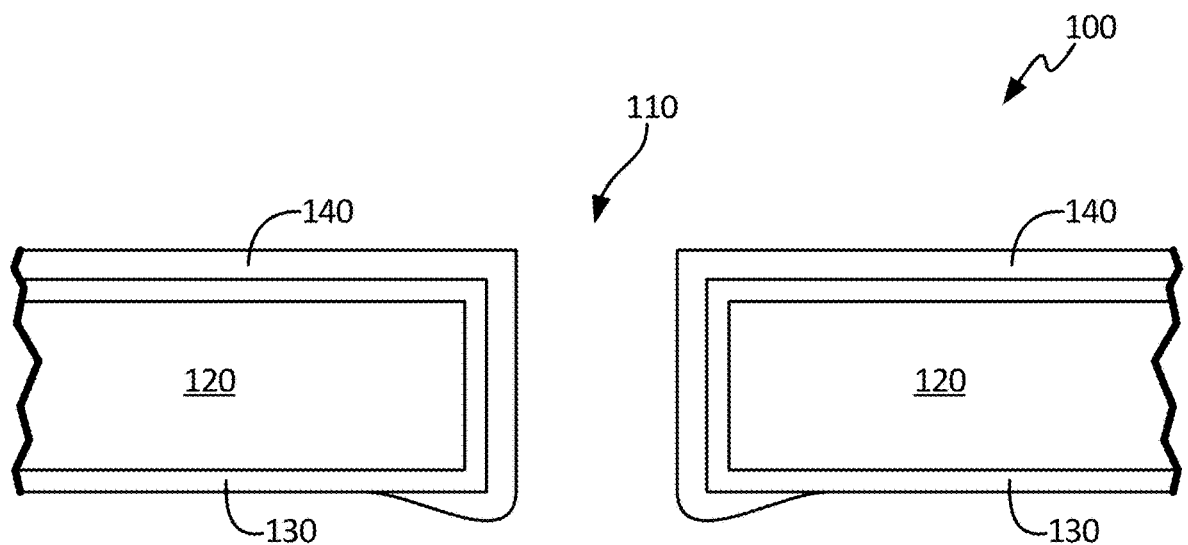
FIG. 2 is a cross-sectional view of an air data probe pressure port with a corrosion protection coating system.

FIG. 2 is a cross-sectional view of an air data probe pressure port with a corrosion protection coating system. FIG. 2 shows air data probe 100 including pressure port 110, body 120, first protection layer 130, and second protection layer 140.

Pressure port 110 can be a static pressure port used to monitor ambient air pressure. Pressure port 110 can be a dynamic pressure port used to monitor, for example, RAM air pressure. Body 120 can be formed of nickel or any nickel alloy capable of withstanding the working temperatures to which it is exposed. For example, some air data probes experience working temperatures in excess of 1000° F. (538° C.).

First protection layer 130 is a uniform pinhole-free layer covering the external and internal surfaces of body 120 including non-line of sight surfaces of air data probe 100. For example, first protection layer 130 is able to be applied through pressure ports 110 and coat the internal surfaces of body 120. First protection layer 130 is applied using atomic layer deposition (ALD) and can be formed of any elements or compounds compatible with ALD and the materials forming underlying body 120. For example, corrosion resistant layer 130 can be selected from the group consisting of a metal oxide, metal nitride, semiconductor, phosphor, fluoride, and combinations thereof.

Metal oxides, for example, can be selected from the group consisting of $Al_2O_3$, $TiO_2$, $ZrO_2$, $HfO_2$, $Ta_2O_5$, $Nb_2O_5$, $Sc_2O_3$, $Y_2O_3$, MgO, $B_2O_3$, $SiO_2$, $GeO_2$, $La_2O_3$, $CeO_2$, $PrO_x$, $Nd_2O_3$, $Sm_2O_3$, $EuO_x$, $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, BixTiyO, BixSiyO, $SrTa_2O_6$, $SrBi_2Ta_2O_9$, $YScO_3$, $LaAlO_3$, $NdAlO_3$, $GdScO_3$, $LaScO_3$, $LaLuO_3$, $LaYbO_3$, $Er_3Ga_5O_{13}$, $In_2O_3$, $In_2O_3$:Sn, $In_2O_3$:F, $In_2O_3$:Zr, $SnO_2$, $SnO_2$:Sb, $Sb_2O_3$, ZnO, ZnO:Al, ZnO:B, ZnO:Ga, $RuO_2$, $RhO_2$, $IrO_2$, $Ga_2O_3$, $VO_2$, $V_2O_5$, $WO_3$, $W_2O_3$, NiO, $CuO_x$, $FeO_x$, $CrO_x$, $CoO_x$, $MnO_x$, $LaCoO_3$, $LaNiO_3$, $LaMnO_3$, $La_{1-x}Ca_xMnO_3$, and combinations thereof.

Metal nitrides, for example, can be selected from the group consisting of BN, AlN, GaN, InN, CrN, $Si_3N_4$, $Ta_3N_5$, $Cu_3N$, $Zr_3N_4$, $Hf_3N_4$, LaN, LuN, TiN, Ti—Si—N, Ti—Al—N, TaN, NbN, MoN, $WN_x$, $WN_xC_y$, $Co_xN$, $Sn_xN$, and combinations thereof.

Semiconductors, for example, can be selected from the group consisting of ZnS, ZnSe, ZnTe, CaS, SrS, BaS, CdS, CdTe, MnTe, GaAs, AlAs, AlP, InP, GaP, InAs, PbS, SnS, $In_2S_3$, $Sb_2S_3$, $Cu_xS$, $CuGaS_2$, $WS_2$, SiC, $Ge_2Sb_2Te_5$ and combinations thereof.

Phosphors, for example, can be selected from the group consisting of ZnS:M (M=Mn,Tb,Tm); CaS:M (M=Eu, Ce, Tb, Pb); SrS:M(M=Ce, Tb, Pb), and combinations thereof.

Fluorides, for example, can be selected from the group consisting of $CaF_2$, $SrF_2$, $MgF_2$, $LaF_3$, $ZnF_2$ and combinations thereof.

First protection layer 130 can also be formed of elements or compounds, for example, selected from the group consisting of Ru, Pt, Ir, Pd, Rh, Ag, Cu, Ni, Co, Fe, Mn, Ta, W, Mo, Ti, Al, Si, Ge, $La_2S_3$, $Y_2O_2S$, $TiC_x$, $TiS_2$, $TaC_x$, $WC_x$, $Ca_3(PO_4)_2$, $CaCO_3$, and combinations thereof.

First protection layer 130 can be made up of one sub-layer deposited by ALD. Alternatively, first protection layer 130 can be made up of multiple sub-layers deposited by ALD in an iterative process described elsewhere herein. Each sub-layer can be formed of the same elements and compounds or each sub-layer can be formed of different elements and compounds. Each sub-layer typically has a thickness of 5 to 10 nanometers (0.0002 to 0.0004 mils). However, first protection layer 130 can have a total thickness from 1 nm to 500 nm (0.00004 to 0.02 mils), inclusive.

The uniform pinhole-free structure of first protection layer 130 reduces corrosion, even if initiated by sulfur or nitrogen containing compounds, compared to a more porous coating or less uniform deposition technique. As such, first protection layer 130 deposited using ALD extends the useful life of air data probe 100 upon exposure to a sulfur containing environment.

Second protection layer 140 is deposited on top of first protection layer 130 using chemical vapor deposition (CVD), physical vapor deposition (PVD), or electroplating techniques. However, the elements or compounds in first protection layer 130 are compatible with the deposition technique used. For example, in one embodiment, first protection layer 130 is conductive in order to use electroplating techniques to deposit second protection layer 140 over first protection layer 130.

Second protection layer 140 is deposited over the areas where first protection layer 130 covers the external surfaces of body 120. The external surfaces of body 120 are most susceptible to FOD and, as such, benefit the most from second protection layer 140. In some embodiments, at least some of the internal surfaces of body 120 are also covered by both first protection layer 130 and second protection layer 140. For example, FIG. 2 shows second protection layer 140 covering first protection layer 130 throughout pressure port 110 and extends part way over first protection layer 130 on the internal surface of body 120 near pressure port 110.

Second protection layer 140 can be formed of a material selected from the group consisting of TiN, TiAlN, CrN, AlCrN, AlN, NiW, WC, CoP, NiP, NiCo, Co, hard chrome, diamond like carbon, and combinations thereof. The thickness of second protection layer 140 is much thicker than first protection layer 130. Second protection layer 140 can be from 1 micron to 25 microns thick. Second protection layer 140 covering first protection layer 130 compared to first protection layer 130 without second protection layer 140 is better able to withstand foreign object damage from dust or particles traveling at high velocities and striking the external surfaces of air data probe 100.

Figure 3:
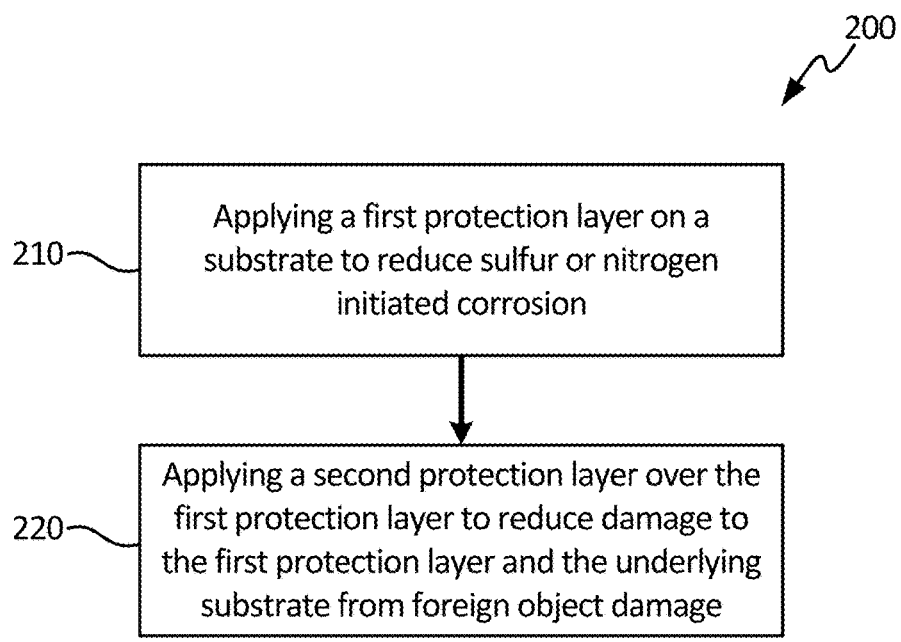
FIG. 3 is a method for coating the air data probe with a corrosion protection coating system.

FIG. 3 is a method for coating the air data probe with a corrosion protection coating system. FIG. 3 shows process 200 including steps 210 and 220. In step 210, body 120 is coated using ALD, which first deposits a single monolayer of a first ALD precursor adsorbed on the surfaces of the air data probe, including any internal surfaces. ALD is a self-limiting process and deposits only a single monolayer of the first precursor. Any non-adsorbed first precursor is removed from the system, leaving behind the ALD intermediate coated air data probe, which includes body 120 and the ALD intermediate corrosion resistant layer.

Next, a second ALD precursor is added, which bonds only with the adsorbed first precursor in a self-limiting process. Any by-products or unreacted second precursor is removed from the system, leaving behind air data probe 100 including body 120 and first protection layer 130. For oxides, the second precursor gas can be, for example, plasma $O_2$, $H_2O$, and $O_3$. For nitrides, the second precursor gas can be, for example, ammonia or plasma nitrogen.

First protection layer 130 can be a single mono-layer deposited by ALD. Alternatively, first protection layer 130 can be more than one mono-layer deposited by ALD. The ALD steps are repeated, forming a second mono-layer making up first protection layer 130. The ALD steps can be repeated in an iterative manner until a desired thickness of first protection layer 130 is formed, which can be from 1 nm to 500 nm (0.00004 to 0.02 mils), inclusive.

In step 220, second protection layer 140 is deposited over first protection layer 130 where first protection layer 130 covers the external surfaces of air data probe 100. Second protection layer 140 is deposited using CVD, PVD, or electroplating techniques and protects both underlying first protection layer 130 and body 120 from FOD.

A corrosion barrier system having a uniform, pinhole-free first protection layer deposited by ALD reduces the amount of corrosion on an air data probe, including corrosion initiated by sulfur or nitrogen compounds compared to a coating having a more porous or less uniform structure. The corrosion barrier system also having a second protection layer deposited by CVD, PVD, or electroplating reduces the amount of erosion of the first protection layer and the underlying body by FOD. The air data probe with these protection layers has a longer useful life compared to an air data probe without one or both of these protection layers.

EXAMPLES

Figure 4A:
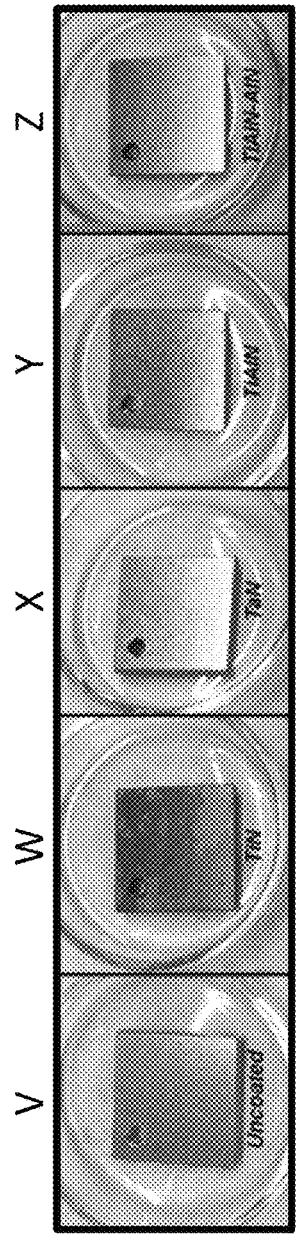
FIGS. 4A-4C are coated and uncoated nickel coupons before and after exposure to corrosive environment.
Figure 4B:
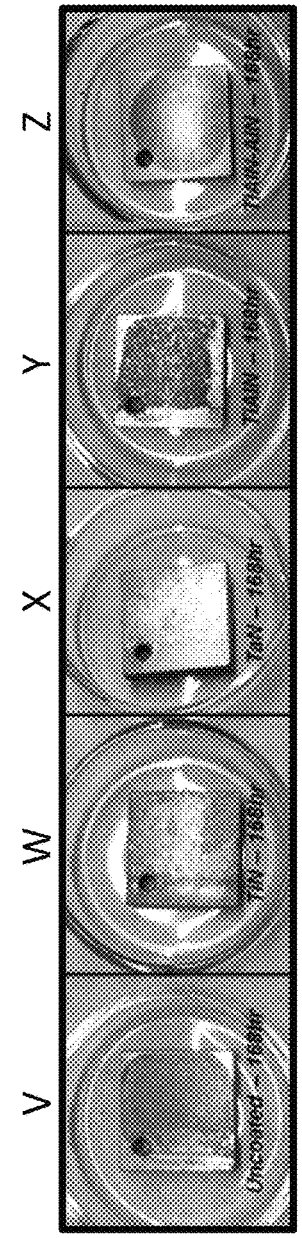
Figure 4C:
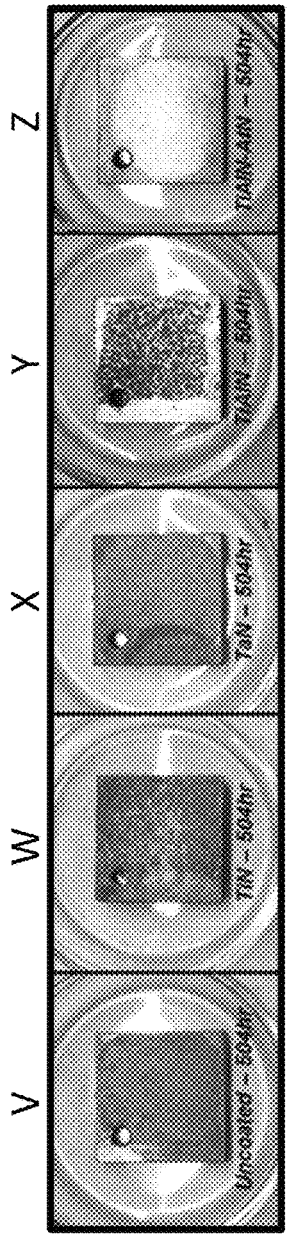

FIGS. 4A-4C are coated and uncoated nickel coupons before and after exposure to a corrosive environment. The corrosive environment entailed depositing about 3 mg/cm$^2$ synthetic sea salt on each coupon and placed in a tube furnace flowing 2.5 ppm $SO_2$ in air with 80% relative humidity. The furnace was ramped up to 800° F. (426° C.) and held for either 168 hours or 504 hours.

FIG. 4A shows nickel 201 coupons before exposure to the corrosive environment. The coupon in column V is uncoated. The coupons in columns W, X, Y, and Z are coated using ALD with TiN, TaN, TiAlN, and TiAlN—AlN, respectively. The coupon in column Z has a first ALD layer formed of TiAlN and a second ALD layer over the first ALD layer formed of AlN.

FIG. 4B shows nickel 201 coupons after exposure to the corrosive environment for 168 hours. The coupon in column V is uncoated. The coupons in columns W, X, Y, and Z are coated using ALD with TiN, TaN, TiAlN, and TiAlN—AlN, respectively. The coupon in column Z has a first ALD layer formed of TiAlN and a second ALD layer over the first ALD layer formed of AlN. The coupons in columns X and Z (coated with TaN and TiAlN—AlN, respectively) show the most resistance to sulfur initiated corrosion under these conditions.

FIG. 4C shows nickel 201 coupons after exposure to the corrosive environment for 504 hours. The coupon in column V is uncoated. The coupons in columns W, X, Y, and Z are coated using ALD with TiN, TaN, TiAlN, and TiAlN—AlN, respectively. The coupon in column Z has a first ALD layer formed of TiAlN and a second ALD layer over the first ALD layer formed of AlN. The coupon in column Z (coated TiAlN—AlN) shows the most resistance to sulfur initiated corrosion under these conditions.

Discussion of Possible Embodiments

The following are non-exclusive descriptions of possible embodiments of the present invention.

An air data probe with a corrosion protection coating system includes a body with an external and an internal surface and a uniform, pinhole-free first protection layer applied by ALD to reduce sulfur and nitrogen initiated corrosion of the body. The air data probe further includes a second protection layer, covering the first protection layer over the external surfaces of the body to protect the air data probe from foreign object impact damage.

The air data probe of the preceding paragraph can optionally include, additionally and/or alternatively, any one or more of the following features, configurations and/or additional components:

The body is formed of nickel or a nickel alloy.

The first protection layer has a thickness from 50 nm to 500 nm, inclusive.

The first protection layer is selected from the group consisting of an oxide, nitride, semiconductor, phosphor, fluoride, and combinations thereof.

The oxide is selected from the group consisting of $Al_2O_3$, $TiO_2$, $ZrO_2$, $HfO_2$, $Ta_2O_5$, $Nb_2O_5$, $Sc_2O_3$, $Y_2O_3$, $MgO$, $B_2O_3$, $SiO_2$, $GeO_2$, $La_2O_3$, $CeO_2$, $PrO_x$, $Nd_2O_3$, $Sm_2O_3$, $EuO_x$, $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $BixTiyO$, $BixSiyO$, $SrTa_2O_6$, $SrBi_2Ta_2O_9$, $YScO_3$, $LaAlO_3$, $NdAlO_3$, $GdScO_3$, $LaScO_3$, $LaLuO_3$, $LaYbO_3$, $Er_3Ga_5O_{13}$, $In_2O_3$, $In_2O_3$:Sn, $In_2O_3$:F, $In_2O_3$:Zr, $SnO_2$, $SnO_2$:Sb, $Sb_2O_3$, $ZnO$, $ZnO$:Al, $ZnO$:B, $ZnO$:Ga, $RuO_2$, $RhO_2$, $IrO_2$, $Ga_2O_3$, $VO_2$, $V_2O_5$, $WO_3$, $W_2O_3$, $NiO$, $CuO_x$, $FeO_x$, $CrO_x$, $CoO_x$, $MnO_x$, $LaCoO_3$, $LaNiO_3$, $LaMnO_3$, $La_{1-x}Ca_xMnO_3$, and combinations thereof.

The nitride is selected from the group consisting of BN, AlN, GaN, InN, CrN, $Si_3N_4$, $Ta_3N_5$, $Cu_3N$, $Zr_3N_4$, $Hf_3N_4$, LaN, LuN, TiN, Ti—Si—N, Ti—Al—N, TaN, NbN, MoN, $WN_x$, $WN_xC_y$, $CO_xN$, $Sn_xN$, and combinations thereof.

The second protection layer is selected from the group consisting of TiN, TiAlN, CrN, AlCrN, AlN, NiW, WC, CoP, NiP, hard chrome, diamond like carbon, and combinations thereof.

The second protection layer is applied by chemical vapor deposition (CVD), physical vapor deposition (PVD), or electroplating.

The second protection layer has a thickness from 1 micron to 25 microns, inclusive.

A method of applying a corrosion protection coating system on an air data probe includes applying a uniform, pinhole-free first protection layer to external and internal surfaces of a body by ALD to reduce sulfur or nitrogen initiated corrosion of the body and applying a second protection layer over the first protection layer on the external surfaces of the substrate to protect the air data probe from foreign object impact damage.

The method of the preceding paragraph can optionally include, additionally and/or alternatively, any one or more of the following features, configurations and/or additional components:

The body is formed of nickel or a nickel alloy.

The first protection layer has a thickness from 50 nm to 500 nm, inclusive.

The first protection layer is selected from the group consisting of an oxide, nitride, semiconductor, phosphor, fluoride, and combinations thereof.

The oxide is selected from the group consisting of $Al_2O_3$, $TiO_2$, $ZrO_2$, $HfO_2$, $Ta_2O_5$, $Nb_2O_5$, $Sc_2O_3$, $Y_2O_3$, $MgO$, $B_2O_3$, $SiO_2$, $GeO_2$, $La_2O_3$, $CeO_2$, $PrO_x$, $Nd_2O_3$, $Sm_2O_3$, $EuO_x$, $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $BixTiyO$, $BixSiyO$, $SrTa_2O_6$, $SrBi_2Ta_2O_9$, $YScO_3$, $LaAlO_3$, $NdAlO_3$, $GdScO_3$, $LaScO_3$, $LaLuO_3$, $LaYbO_3$, $Er_3Ga_5O_{13}$, $In_2O_3$, $In_2O_3$:Sn, $In_2O_3$:F, $In_2O_3$:Zr, $SnO_2$, $SnO_2$:Sb, $Sb_2O_3$, $ZnO$, $ZnO$:Al, $ZnO$:B, $ZnO$:Ga, $RuO_2$, $RhO_2$, $IrO_2$, $Ga_2O_3$, $VO_2$, $V_2O_5$, $WO_3$, $W_2O_3$, $NiO$, $CuO_x$, $FeO_x$, $CrO_x$, $CoO_x$, $MnO_x$, $LaCoO_3$, $LaNiO_3$, $LaMnO_3$, $La_{1-x}Ca_xMnO_3$, and combinations thereof.

The nitride is selected from the group consisting of BN, AlN, GaN, InN, CrN, $Si_3N_4$, $Ta_3N_5$, $Cu_3N$, $Zr_3N_4$, $Hf_3N_4$, LaN, LuN, TiN, Ti—Si—N, Ti—Al—N, TaN, NbN, MoN, $WN_x$, $WN_xC_y$, $CO_xN$, $Sn_xN$, and combinations thereof.

The second protection layer is selected from the group consisting of TiN, TiAlN, CrN, AlCrN, AlN, NiW, WC, CoP, NiP, NiCo, Co, hard chrome, diamond like carbon, and combinations thereof.

The second protection layer is applied by CVD, PVD, or electroplating.

The second protection layer has a thickness from 1 micron to 25 microns, inclusive.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An air data probe with a corrosion protection coating system, the air data probe comprising:
   a body with an external and an internal surface;
   a uniform, pinhole-free first protection layer applied by atomic layer deposition (ALD), covering the external and internal surfaces of the body to reduce corrosion of the body, including corrosion initiated by sulfur and nitrogen compounds; and
   a second protection layer, covering the first protection layer over the external surfaces of the body to protect the air data probe from foreign object impact damage.

2. The air data probe of claim 1, wherein the body is formed of nickel or a nickel alloy.

3. The air data probe of claim 1, wherein the first protection layer has a thickness from 50 nm to 500 nm, inclusive.

4. The air data probe of claim 1, wherein the first protection layer is selected from the group consisting of an oxide, nitride, semiconductor, phosphor, fluoride, and combinations thereof.

5. The air data probe of claim 4, wherein the oxide is selected from the group consisting of $Al_2O_3$, $TiO_2$, $ZrO_2$, $HfO_2$, $Ta_2O_5$, $Nb_2O_5$, $Sc_2O_3$, $Y_2O_3$, $MgO$, $B_2O_3$, $SiO_2$, $GeO_2$, $La_2O_3$, $CeO_2$, $PrO_x$, $Nd_2O_3$, $Sm_2O_3$, $EuO_x$, $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $BixTiyO$, $BixSiyO$, $SrTa_2O_6$, $SrBi_2Ta_2O_9$, $YScO_3$, $LaAlO_3$, $NdAlO_3$, $GdScO_3$, $LaScO_3$, $LaLuO_3$, $LaYbO_3$, $Er_3Ga_5O_{13}$, $In_2O_3$, $In_2O_3$:Sn, $In_2O_3$:F, $In_2O_3$:Zr, $SnO_2$, $SnO_2$:Sb, $Sb_2O_3$, $ZnO$, $ZnO$:Al, $ZnO$:B, $ZnO$:Ga, $RuO_2$, $RhO_2$, $IrO_2$, $Ga_2O_3$, $VO_2$, $V_2O_5$, $WO_3$, $W_2O_3$, $NiO$, $CuO_x$, $FeO_x$, $CrO_x$, $CoO_x$, $MnO_x$, $LaCoO_3$, $LaNiO_3$, $LaMnO_3$, $La_{1-x}Ca_xMnO_3$, and combinations thereof.

6. The air data probe of claim 4, wherein the nitride is selected from the group consisting of BN, AlN, GaN, InN, CrN, $Si_3N_4$, $Ta_3N_5$, $Cu_3N$, $Zr_3N_4$, $Hf_3N_4$, LaN, LuN, TiN, Ti—Si—N, Ti—Al—N, TaN, NbN, MoN, $WN_x$, $WN_xC_y$, $Co_xN$, $Sn_xN$, and combinations thereof.

7. The air data probe of claim 1, wherein the second protection layer is selected from the group consisting of TiN, TiAlN, CrN, AlCrN, AlN, NiW, WC, CoP, NiP, hard chrome, diamond like carbon, and combinations thereof.

8. The air data probe of claim 1, wherein the second protection layer is applied by chemical vapor deposition (CVD), physical vapor deposition (PVD), or electroplating.

9. The air data probe of claim 1, wherein the second protection layer has a thickness from 1 micron to 25 microns, inclusive.

10. A method of applying a corrosion protection coating system on an air data probe, the method comprising:
    applying, by atomic layer deposition (ALD), a uniform, pinhole-free first protection layer to external and internal surfaces of a body to reduce corrosion of the body, including corrosion initiated by sulfur and nitrogen compounds; and
    applying a second protection layer over the first protection layer on the external surfaces of the body to protect the air data probe from foreign object impact damage.

11. The method of claim 10, wherein the body is formed of nickel or a nickel alloy.

12. The method of claim 10, wherein the first protection layer has a thickness from 50 nm to 500 nm, inclusive.

13. The method of claim 10, wherein the first protection layer is selected from the group consisting of an oxide, nitride, semiconductor, phosphor, fluoride, and combinations thereof.

14. The method of claim 13, wherein the oxide is selected from the group consisting of $Al_2O_3$, $TiO_2$, $ZrO_2$, $HfO_2$, $Ta_2O_5$, $Nb_2O_5$, $Sc_2O_3$, $Y_2O_3$, $MgO$, $B_2O_3$, $SiO_2$, $GeO_2$, $La_2O_3$, $CeO_2$, $PrO_x$, $Nd_2O_3$, $Sm_2O_3$, $EuO_x$, $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $BixTiyO$, $BixSiyO$, $SrTa_2O_6$, $SrBi_2Ta_2O_9$, $YScO_3$, $LaAlO_3$, $NdAlO_3$, $GdScO_3$, $LaScO_3$, $LaLuO_3$, $LaYbO_3$, $Er_3Ga_5O_{13}$, $In_2O_3$, $In_2O_3$:Sn, $In_2O_3$:F, $In_2O_3$:Zr, $SnO_2$, $SnO_2$:Sb, $Sb_2O_3$, $ZnO$, $ZnO$:Al, $ZnO$:B, $ZnO$:Ga, $RuO_2$, $RhO_2$, $IrO_2$, $Ga_2O_3$, $VO_2$, $V_2O_5$, $WO_3$, $W_2O_3$, $NiO$, $CuO_x$, $FeO_x$, $CrO_x$, $CoO_x$, $MnO_x$, $LaCoO_3$, $LaNiO_3$, $LaMnO_3$, $La_{1-x}Ca_xMnO_3$, and combinations thereof.

15. The method of claim 13, wherein the nitride is selected from the group consisting of BN, AlN, GaN, InN, CrN, $Si_3N_4$, $Ta_3N_5$, $Cu_3N$, $Zr_3N_4$, $Hf_3N_4$, LaN, LuN, TiN, Ti—Si—N, Ti—Al—N, TaN, NbN, MoN, $WN_x$, $WN_xC_y$, $Co_xN$, $Sn_xN$, and combinations thereof.

16. The method of claim 10, wherein the second protection layer is selected from the group consisting of TiN, TiAlN, CrN, AlCrN, AlN, NiW, WC, CoP, NiP, NiCo, Co, hard chrome, diamond like carbon, and combinations thereof.

17. The method of claim 10, wherein the second protection layer is applied by CVD, PVD, or electroplating.

18. The method of claim 10, wherein the second protection layer has a thickness from 1 micron to 25 microns, inclusive.

19. An air data probe with a corrosion protection coating system, the air data probe comprising:
    a body with an external and an internal surface;
    a uniform, pinhole-free first protection layer applied by atomic layer deposition (ALD), covering the external and internal surfaces of the body to reduce corrosion of the body, including corrosion initiated by sulfur and nitrogen compounds, wherein the first protection layer has a thickness from 50 nm to 500 nm, inclusive, and wherein the first protective layer comprises a plurality of sub-layers and each of the plurality of sub-layers has a thickness from 5 nm to 10 nm, inclusive; and
    a second protection layer, covering the first protection layer over the external surfaces of the body to protect the air data probe from foreign object impact damage; wherein the second protective layer covers at least some of the internal surface of the body.

20. The air data probe of claim 19, wherein at least one of the plurality of sub-layers is formed from a compound that is different from each other of the plurality of sub-layers.

* * * * *